(12) United States Patent
Lee et al.

(10) Patent No.: US 9,922,825 B2
(45) Date of Patent: Mar. 20, 2018

(54) ELECTRONICS DEVICE HAVING TWO-DIMENSIONAL (2D) MATERIAL LAYER AND METHOD OF MANUFACTURING THE ELECTRONIC DEVICE BY INKJET PRINTING

(71) Applicant: Samsung Electronics Co., Ltd., Suwon-si, Gyeonggi-do (KR)

(72) Inventors: Minhyun Lee, Yongin-si (KR); Hyeonjin Shin, Suwon-si (KR); Jaeho Lee, Seoul (KR); Haeryong Kim, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/728,583

(22) Filed: Jun. 2, 2015

(65) Prior Publication Data
US 2016/0190244 A1 Jun. 30, 2016

(30) Foreign Application Priority Data

Dec. 30, 2014 (KR) ........................ 10-2014-0194323

(51) Int. Cl.
| | |
|---|---|
| *H01L 29/06* | (2006.01) |
| *H01L 21/02* | (2006.01) |
| *H01L 29/78* | (2006.01) |
| *H01L 29/786* | (2006.01) |
| *H01L 29/66* | (2006.01) |

(Continued)

(52) U.S. Cl.
CPC .... *H01L 21/02568* (2013.01); *H01L 21/0259* (2013.01); *H01L 21/02628* (2013.01); *H01L 29/0673* (2013.01); *H01L 29/66742* (2013.01); *H01L 29/66969* (2013.01); *H01L 29/778* (2013.01); *H01L 29/786* (2013.01); *H01L 29/7839* (2013.01); *H01L 29/1606* (2013.01); *H01L 29/24* (2013.01); *H01L 29/413* (2013.01)

(58) Field of Classification Search
CPC ....... H01L 29/1606; H01L 2224/73265; H01L 29/778
See application file for complete search history.

(56) References Cited

U.S. PATENT DOCUMENTS

| | | | | |
|---|---|---|---|---|
| 9,142,639 B2 * | 9/2015 | Kim | ................ | B82Y 10/00 |
| 9,145,294 B2 * | 9/2015 | Patti | ................ | B82Y 10/00 |

(Continued)

FOREIGN PATENT DOCUMENTS

| | | |
|---|---|---|
| KR | 20120133873 A | 12/2012 |
| KR | 20130033211 A | 4/2013 |

(Continued)

OTHER PUBLICATIONS

Qing Hua Wang et al.,"Electronics and optoelectronics of two-dimensional transition metal dichalcogenides", Nature Nanotechnology vol. 7, Nov. 6, 2012, pp. 699-712.

*Primary Examiner* — Jaehwan Oh
(74) *Attorney, Agent, or Firm* — Harness, Dickey & Pierce, P.L.C.

(57) ABSTRACT

An electronic device includes first and second electrodes that are spaced apart from each other and a 2D material layer. The 2D material layer connects the first and second electrodes. The 2D material layer includes a plurality of 2D nanomaterials. At least some of the 2D nanomaterials overlap one another.

15 Claims, 9 Drawing Sheets

(51) Int. Cl.
  *H01L 29/778* (2006.01)
  *H01L 29/24* (2006.01)
  *H01L 29/41* (2006.01)
  *H01L 29/16* (2006.01)

(56) References Cited

U.S. PATENT DOCUMENTS

| | | | |
|---|---|---|---|
| 9,269,773 B2 * | 2/2016 | Chen | B82Y 30/00 |
| 9,318,591 B2 * | 4/2016 | Geim | H01L 29/775 |
| 2007/0153363 A1 * | 7/2007 | Gruner | B82Y 10/00 |
| | | | 359/315 |
| 2010/0200839 A1 * | 8/2010 | Okai | C23C 16/26 |
| | | | 257/29 |
| 2010/0323178 A1 * | 12/2010 | Ruoff | C04B 35/14 |
| | | | 428/220 |
| 2011/0042650 A1 * | 2/2011 | Avouris | H01L 29/1606 |
| | | | 257/29 |
| 2011/0068290 A1 * | 3/2011 | Haddon | C12Q 1/6881 |
| | | | 252/62.51 R |
| 2013/0175513 A1 * | 7/2013 | Ford | H01L 51/0591 |
| | | | 257/40 |
| 2013/0196463 A1 * | 8/2013 | Zhu | H01L 29/4908 |
| | | | 438/52 |
| 2013/0216894 A1 * | 8/2013 | Wang | H01M 4/13 |
| | | | 429/158 |
| 2013/0285012 A1 * | 10/2013 | Lee | H01L 33/04 |
| | | | 257/13 |
| 2013/0302593 A1 * | 11/2013 | Coleman | C01G 35/00 |
| | | | 428/323 |
| 2013/0309776 A1 * | 11/2013 | Drndic | G01N 27/26 |
| | | | 436/94 |
| 2014/0008616 A1 * | 1/2014 | Geim | H01L 29/1606 |
| | | | 257/24 |
| 2014/0023926 A1 * | 1/2014 | Li | H01M 4/133 |
| | | | 429/213 |
| 2014/0042390 A1 * | 2/2014 | Gruner | H01M 4/364 |
| | | | 257/14 |
| 2014/0057425 A1 * | 2/2014 | Afzali-Ardakani | H01L 29/45 |
| | | | 438/594 |
| 2014/0197459 A1 * | 7/2014 | Kis | H01L 29/66742 |
| | | | 257/194 |
| 2014/0231888 A1 | 8/2014 | Kelber et al. | |
| 2014/0273259 A1 * | 9/2014 | Friedman | G01N 27/02 |
| | | | 436/112 |
| 2014/0287239 A1 * | 9/2014 | Scurati | B29C 65/4855 |
| | | | 428/408 |
| 2014/0319452 A1 * | 10/2014 | Seabaugh | H01L 29/1606 |
| | | | 257/9 |
| 2015/0034907 A1 * | 2/2015 | Hersam | H01L 29/8611 |
| | | | 257/26 |
| 2015/0064471 A1 * | 3/2015 | Dresselhaus | C23C 14/12 |
| | | | 428/408 |
| 2015/0116906 A1 * | 4/2015 | Thevasahayam | H01G 11/28 |
| | | | 361/502 |
| 2015/0166340 A1 * | 6/2015 | Son | C01G 23/043 |
| | | | 428/220 |
| 2015/0303315 A1 * | 10/2015 | Das | H01L 29/78681 |
| | | | 257/347 |
| 2015/0318401 A1 * | 11/2015 | Duan | H01L 29/66742 |
| | | | 250/200 |
| 2015/0337145 A1 * | 11/2015 | Torrisi | C09D 11/037 |
| | | | 428/207 |
| 2016/0104790 A1 * | 4/2016 | Oh | H01L 29/778 |
| | | | 257/29 |
| 2016/0123919 A1 * | 5/2016 | Johnson | G01N 33/54373 |
| | | | 506/38 |
| 2016/0141427 A1 * | 5/2016 | Chen | H01L 29/78696 |
| | | | 257/349 |
| 2016/0155971 A1 * | 6/2016 | Strachan | H01L 51/0558 |
| | | | 257/29 |
| 2016/0190244 A1 * | 6/2016 | Lee | H01L 29/778 |
| | | | 257/29 |
| 2016/0248007 A1 * | 8/2016 | Hersam | H01L 27/2463 |
| 2016/0290955 A1 * | 10/2016 | Zhong | B82Y 30/00 |

FOREIGN PATENT DOCUMENTS

| | | |
|---|---|---|
| KR | 20130037483 A | 4/2013 |
| KR | 20130108576 A | 10/2013 |
| KR | 20140015057 A | 2/2014 |
| KR | 20140103514 A | 8/2014 |

* cited by examiner

ELECTRONICS DEVICE HAVING TWO-DIMENSIONAL (2D) MATERIAL LAYER AND METHOD OF MANUFACTURING THE ELECTRONIC DEVICE BY INKJET PRINTING

RELATED APPLICATION

This application claims priority under 35 U.S.C. § 119 to Korean Patent Application No. 10-2014-0194323, filed on Dec. 30, 2014, in the Korean Intellectual Property Office, the disclosure of which is incorporated herein in its entirety by reference.

BACKGROUND

1. Field

The present disclosure relates to electronic devices including two-dimensional (2D) material layers and/or methods of manufacturing the electronic devices by inkjet printing.

2. Description of Related Art

Graphene has a structure in which carbon atoms are connected to one another in a two-dimensional (2D) manner. Graphene may have an atomic-level thickness. Graphene has a higher electron mobility and a higher thermal conductivity than silicon (Si). Graphene is chemically stable. Graphene may have a large surface area. However, since graphene may have a band gap of 0 eV, a transistor including graphene as a channel material may have a low on/off current ratio. Accordingly, a high standby current may be generated in a transistor including graphene. Thus, the operation efficiency of a transistor device including graphene may be reduced. Methods of modifying graphene have been suggested in order to improve the operation efficiency of a transistor including graphene. However, although an on/off current ratio of a transistor including graphene may be increased by modifying graphene, modifying graphene may also reduce the on-current density or carrier mobility and an increase manufacturing costs for a transistor device.

SUMMARY

The present disclosure relates electronic devices including two-dimensional (2D) material layers and/or methods of manufacturing the electronic devices by using inkjet printing.

Additional aspects will be set forth in part in the description which follows and, in part, will be apparent from the description, or may be learned by practice of example embodiments.

According to example embodiments, an electronic device includes a first electrode, a second electrode spaced apart from the first electrode, and a two-dimensional (2D) material layer that is connected to the first and second electrodes. The 2D material layer includes a plurality of 2D nanomaterials. At least some of the 2D nanomaterials overlap one another.

In example embodiments, the 2D nanomaterials may have semiconductor characteristics.

In example embodiments, the 2D material layer may further include a conductive material. The conductive material may include at least one of graphene, conductive particles, conductive nanotubes, and conductive nanowires.

In example embodiments, 2D material layer may further include a dopant. The 2D material layer be a channel layer of the electrode device. The electronic device may further include a gate insulating layer on the 2D material layer, and a gate electrode on the gate insulating layer.

In example embodiments, a Schottky junction may be formed between the 2D material layer and at least one of the first and second electrodes. A p-n junction may be formed between the plurality of 2D nanomaterials.

In example embodiments, each of the plurality of 2D nanomaterials may include at least one layer.

In example embodiments, each of the plurality of 2D nanomaterials may include at least one of a transition metal dichalcogenide (TMD), phosphorene (black phosphorus), germanane, and silicene.

According to example embodiments, a method of manufacturing an electronic device includes forming by inkjet printing a two-dimensional (2D) material layer on a substrate, the 2D material layer including a plurality of 2D nanomaterials that have semiconductor characteristics and at least some of the 2D nanomaterials overlap one another, and forming a first electrode and a second electrode that are connected to the 2D material layer.

In example embodiments, the forming the 2D material layer may include forming an ink pattern by ejecting ink onto the substrate, and drying the ink pattern. The ink may include a solvent and the 2D nanomaterials.

In example embodiments, a mixture ratio of the 2D nanomaterials to the solvent in the ink may range from about 1 µg/mL to about 100 mg/mL.

In example embodiments, the ink may further include a conductive material. The ink may further include a dopant. The 2D nanomaterials may be doped with impurities.

In example embodiments, the first and second electrodes may be formed by inkjet printing.

In example embodiments, the method may further include forming a gate insulating layer on the 2D material layer, and forming a gate electrode on the gate insulating layer. The gate insulating layer and the gate electrode may be formed by inkjet printing.

According to example embodiments a method of manufacturing an electronic device includes forming a two-dimensional (2D) material layer, forming a first electrode connected to a first part of the 2D material layer, and forming a second electrode connected to a second part of the 2D material layer. The 2D material layer includes a plurality of 2D nanomaterials that have semiconductor characteristics. At least some of the 2D nanomaterials overlap one another. The second electrode is spaced apart from the first electrode.

In example embodiments, the method may further include forming a gate electrode on a substrate and forming a gate insulating layer on the substrate. The forming the 2D material layer may include inkjet printing an ink pattern on the substrate and drying the ink pattern. The ink may include a solvent and the 2D nanomaterials. The forming the gate insulating layer may include one of (i) forming the gate insulating layer on top of the gate electrode and (ii) forming the gate insulating layer between the gate electrode and the substrate. The gate insulating layer may extend between the 2D material layer and the gate electrode.

In example embodiments, the 2D nanomaterials may include one of a transition metal dichalcogenide (TMD), phosphorene, germanane, and silicene.

In example embodiments, the forming the first electrode may include forming a Schottky junction between the 2D material layer and the first electrode at the first part of the 2D material layer.

In example embodiments, the 2D material layer may include one of a conductive material and a dopant on the 2D nanomaterials. The conductive material may include one of graphene, conductive particles, conductive nanotubes, and conductive nanowires.

BRIEF DESCRIPTION OF THE DRAWINGS

These and/or other aspects will become apparent and more readily appreciated from the following description of non-limiting embodiments, taken in conjunction with the accompanying drawings like reference characters refer to like parts throughout the different views. The drawings are not necessarily to scale, emphasis instead being placed upon illustrating principles of inventive concepts. In the drawings.

DETAILED DESCRIPTION

Figure 1:
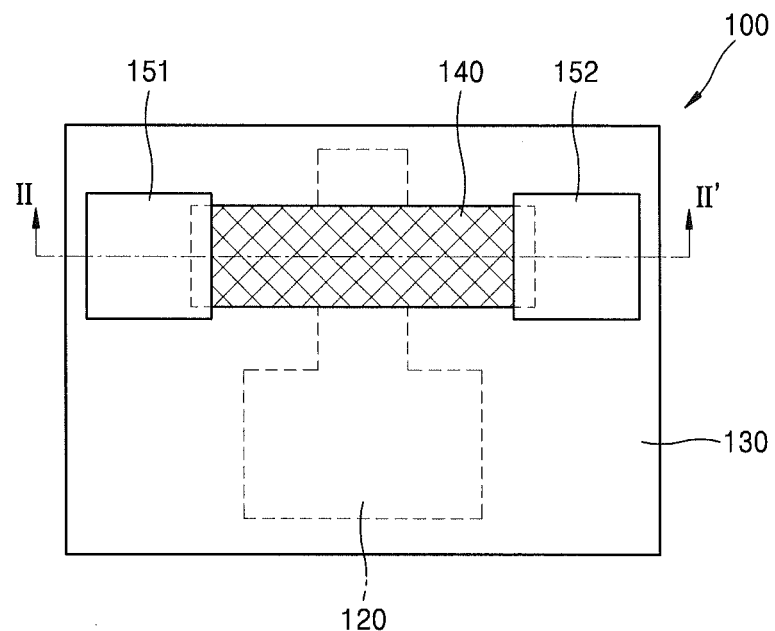
FIG. 1 is a plan view illustrating an electronic device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
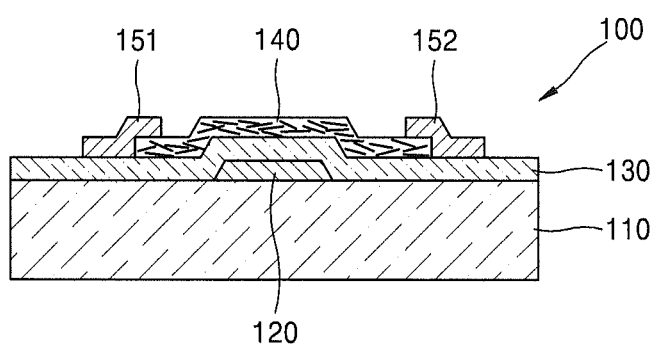
FIG. 2 is a cross-sectional view taken along line II-II' of FIG. 1.

FIG. 1 is a plan view illustrating an electronic device 100 according to example embodiments. FIG. 2 is a cross-sectional view taken along line II-II' of FIG. 1. The electronic device 100 illustrated in FIGS. 1 and 2 is a transistor device having an under-gate structure.

Referring to FIGS. 1 and 2, the electronic device 100 may include a gate electrode 120, a gate insulating layer 130, a two-dimensional (2D) material layer 140, and first and second electrodes 151 and 152. The gate electrode 120 may be provided on a substrate 110. The substrate 110 may be, for example, a semiconductor substrate (e.g., silicon substrate). However, example embodiments are not limited thereto, and the substrate 110 may be formed of any of various materials. Also, the substrate 110 may be formed of a flexible material such as a plastic substrate. An insulating layer (not shown) may be further provided on a top surface of the substrate 110 in order to insulate the substrate 110 from the gate electrode 120. The insulating layer may include, for example, but is not limited to, silicon oxide or silicon nitride. When the substrate 110 includes an insulating material, the insulating layer may not be provided on the top surface of the substrate 110.

The gate electrode 120 may include a conductive material. For example, the gate electrode 120 may include graphene, carbon nanotubes (CNTs), or a metal such as silver (Ag), gold (Au), platinum (Pt), or copper (Cu). However, example embodiments are not limited thereto, and the gate electrode 120 may include any of other various conductive materials. The gate insulating layer 130 is provided on the substrate 110 to cover the gate electrode 120. The gate insulating layer 130 may include various insulating materials. For example, the gate insulating layer 130 may include, but is not limited to, silicon oxide, silicon nitride, silicon oxynitride, aluminum oxide, hafnium oxide, and/or insulating polymer. The gate insulating layer 130 may be formed by using inkjet printing as described below.

Figure 3:
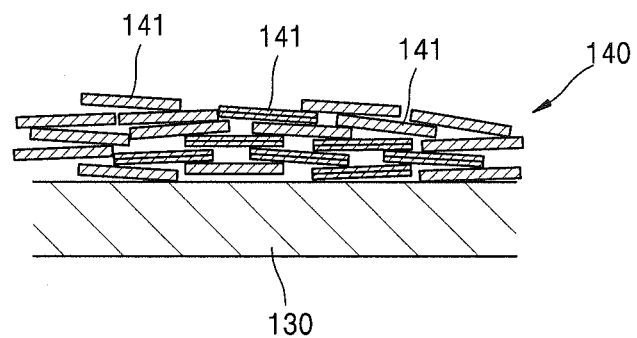
FIG. 3 is an enlarged cross-sectional view illustrating a two-dimensional (2D) material layer of FIG. 2.

The 2D material layer 140 is provided on the gate insulating layer 130. The 2D material layer 140 may function as a channel layer. The 2D material layer 140 is disposed to correspond to the gate electrode 120. FIG. 3 is an enlarged cross-sectional view illustrating the 2D material layer 140 of FIG. 2. As shown in FIG. 3, the 2D material layer 140 may be formed so that at least some of a plurality of 2D nanomaterials 141 overlap one another. The 2D nanomaterials 141 are nano-sized materials having semiconductor characteristics and having a 2D crystal structure.

Each of the 2D nanomaterials 141 may include one layer or a plurality of layers. For example, each of the 2D nanomaterials 141 may include tens of layers (e.g., about 10 to about 90 layers). Each layer of each of the 2D nanomaterials 141 may have a thickness that is equal to or less than about several nanometers (nm). For example, each layer of each of the 2D nanomaterials 141 may have, but is not limited to, a thickness that is greater than 0 nm and equal to or less than about 2 nm. Each layer of each of the 2D nanomaterials 141 may have a size that ranges from about tens of nm to about hundreds of nm (e.g., about 10 nm to about 900 nm). Each of the 2D nanomaterials 141 may have any of various planar shapes such as a quadrangular shape or a pentagonal shape.

As such, the 2D material layer 140 may be formed so that some of the 2D nanomaterials 141 overlap one another. The 2D material layer 140 may be formed by using inkjet printing as described below. The 2D material layer 140 that is formed by using inkjet printing may have a thickness that ranges from about several nm (e.g., 3 nm) to about hundreds of nm (e.g., about 100 to about 900 nm) and a size that ranges from about hundreds of nm to (e.g., 100 nm or more) about hundreds of micrometers (μm) (e.g., about 900 μm).

As such, when the 2D material layer 140 is formed by using inkjet printing, the 2D material layer 140 may be formed to have a large area.

As described above, the 2D material layer 140 includes the 2D nanomaterials 141 having semiconductor characteristics. For example, the 2D nanomaterials 141 may include at least one selected from the group consisting of transition metal dichalcogenide (TMD), phosphorene (black phosphorus), germanane, and silicene. TMD may include at least one selected from the group consisting of $MoS_2$, $MoSe_2$, $MoTe_2$, $WS_2$, $WSe_2$, $WTe_2$, $TaS_2$, $TaSe_2$, $TiS_2$, $TiSe_2$, $HfS_2$, $HfSe_2$, $SnS_2$, $SnSe_2$, $GeS_2$, $GeSe_2$, $GaS_2$, $GaSe_2$, $Bi_2S_3$, $Bi_2Se_3$, and $Bi_2Te_3$.

The 2D material layer 140 including the 2D nanomaterials 141 having semiconductor characteristics has lower mobility than graphene but has a bandgap that is greater than 0 eV. Accordingly, when the 2D material layer 140 is used as a channel layer of the electronic device 100 that is a transistor device, an on/off current ratio may be increased to be equal to or greater than 100, thereby improving operation efficiency of the electronic device 100.

The first and second electrodes 151 and 152 are provided on both sides of the 2D material layer 140. The first and second electrodes 151 and 152 are provided on the gate insulating layer 130 to be electrically connected to the 2D material layer 140. The first and second electrodes 151 and 152 may be respectively a source electrode and a drain electrode. Alternatively, the first and second electrodes 151 and 152 may be a drain electrode and a source electrode. The first and second electrodes 151 and 152 may include a conductive material, like the gate electrode 120. For example, the first and second electrodes 151 and 152 may include graphene, CNTs, or a metal such as Ag, Au, Pt, or Cu. As described below, the first and second electrodes 151 and 152 and the gate electrode 120 may be formed by using inkjet printing.

Figure 4:
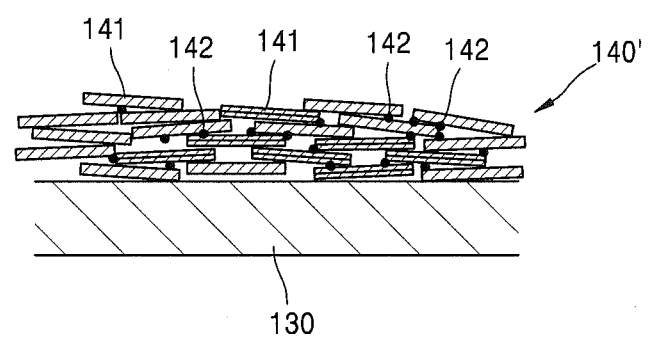
FIG. 4 is a cross-sectional view illustrating a modification of the 2D material layer of FIG. 2.

Although a case where the 2D material layer 140 includes the 2D nanomaterials 141 has been described, the 2D material layer 140 may further include a material in addition to the 2D nanomaterials 141. FIG. 4 is a cross-sectional view illustrating a modification of the 2D material layer 140 of FIG. 2. Referring to FIG. 4, a 2D material layer 140' includes the plurality of 2D nanomaterials 141 and a conductive material 142. The 2D nanomaterials 141 are provided so that at least some of the 2D nanomaterials 141 overlap one another. The conductive material 142 may be attached to the 2D nanomaterials 141 and may increase electrical conductivity between the 2D nanomaterials 141. Accordingly, an on-current of the electronic device 100 may be increased due to the conductive material 142 that is included in the 2D material layer 140.

The conductive material 142 that is included in the 2D material layer 140 may include at least one among, for example, graphene, conductive particles, conductive nanotubes, and conductive nanowires. The conductive particles may include at least one selected from the group consisting of, for example, Ag, Au, Pt, Cu, and fullerene. The conductive nanotubes may include, for example, CNTs. The conductive nanowires may include, for example, Ag nanowires. However, example embodiments are not limited thereto.

A dopant may be further included in the 2D material layer 140 including the 2D nanomaterials 141 or the 2D material layer 140' including both the 2D nanomaterials 141 and the conductive material 142. The dopant may allow specific electric charges to pass therethrough. Accordingly, an off-current of the electronic device 100 may be reduced due to the dopant that is included in the 2D material layer 140. The dopant may be included in ink when the 2D material layer 140 is formed by using inkjet printing as described below. The 2D nanomaterials 141 that are included in the 2D material layer 140 may be previously doped with impurities. The dopant may include an alkali metal (e.g., K or Li), $AuCl_3$, or a polymer such as polyethylenimine, $HPtCl_4$, $AuCl_3$, $HAuCl_4$, silver trifluoromethanesulfonate (AgOTf), $AgNO_3$, $H_2PdCl_6$, $Pd(OAc)_2$, $Cu(CN)_2$, but is not limited thereto.

As described above, since the 2D material layer 140 including the 2D nanomaterials 141 having semiconductor characteristics is used as a channel layer of the electronic device 100, operation efficiency of the electronic device 100 may be improved. When the 2D material layer 140 is formed by using inkjet printing as described below, the electronic device 100 may be formed to have a large area.

A method of forming a 2D material layer by using inkjet printing will now be explained. FIGS. 5A through 5D are cross-sectional views for explaining a method of forming a 2D material layer, according to example embodiments.

Figure 5A:
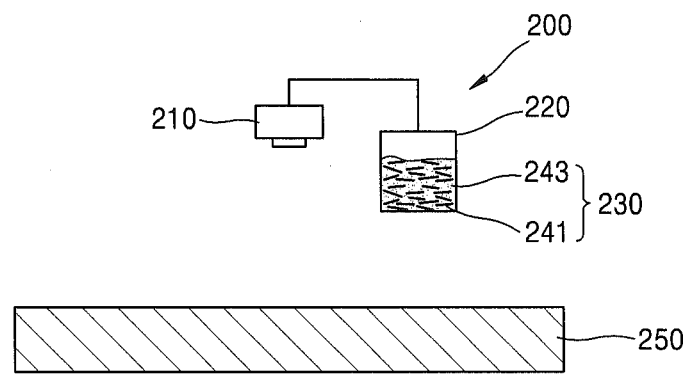
FIGS. 5A through 5D are cross-sectional views for explaining a method of forming a 2D material layer, according to example embodiments.

Referring to FIG. 5A, an inkjet printing apparatus 200 is provided on a substrate 250. The inkjet printing apparatus 200 may include an ink chamber 220 in which ink 230 for forming a 2D material layer 240 (see FIG. 5D) is filled and an inkjet head 210 that ejects the ink 230 onto the substrate 250. The inkjet printing apparatus 200 may eject the ink 230 by using, for example, but not limited to, thermal inkjet printing or piezoelectric inkjet printing.

The ink 230 for forming the 2D material layer 240 may be prepared by mixing a plurality of nanomaterials 241 with a solvent 243. The solvent 243 may include at least one selected from the group consisting of, for example, but not limited to, water, acetone, methanol, ethanol, isopropanol, cyclohexanone, cyclohexane, chlorobenzene, chloroform, formamide, N-methyl formamide, N-methyl pyrrolidinone, N-vinyl pyrrolidinone, dimethylsulphoxide, benzonitrile, cyclohecyl-pyrrolidinone, N-dodecyl pyrrolidone, benzyl benzoate, benzyl ether bromobenzene, dimethylacetamide, and dimethylformamide.

The ink 230 for forming the 2D material layer 240 may be prepared by mixing the 2D nanomaterials 241 with the solvent 243. A mixture ratio of the 2D nanomaterials 241 to the solvent 243 may range from, but is not limited to, about 1 μg/mL to about 100 mg/mL. The 2D nanomaterials 241 are nano-sized materials having semiconductor characteristics and a 2D crystal structure. Each of the 2D nanomaterials 241 may include one layer or a plurality of layers. Each layer of each of the 2D nanomaterials 241 may have a thickness equal to or less than about several nm and may have a size that ranges from about tens of nm to about hundreds of nm.

Each of the 2D nanomaterials 241 may include a semiconductor material. For example, each of the 2D nanomaterials 241 may include at least one selected from the group consisting of, for example, TMD, phosphorene (black phosphorus), germanane, and silicene. TMD may include at least one selected from the group consisting of, for example, $MoS_2$, $MoSe_2$, $MoTe_2$, $WS_2$, $WSe_2$, $WTe_2$, $TaS_2$, $TaSe_2$, $TiS_2$, $TiSe_2$, $HfS_2$, $HfSe_2$, $SnS_2$, $SnSe_2$, $GeS_2$, $GeSe_2$, $GaS_2$, $GaSe_2$, $Bi_2S_3$, $Bi_2Se_3$, and $Bi_2Te_3$. The 2D nanomaterials 241 may include an undoped semiconductor material. Alternatively, the 2D nanomaterials 241 may be doped with desired (and/or alternatively predetermined) impurities. In this case, the ink 230 may be prepared by mixing the 2D nanomaterials 241 that are previously doped with impurities with the solvent 243.

A conductive material (not shown) may be further included in the ink 230 for forming the 2D material layer 240. The conductive material may include at least one among, for example, graphene, conductive particles, conductive nanotubes, and conductive nanowires. The conductive particles may include at least one selected from the group consisting of, for example, Ag, Au, Pt, Cu, and fullerene. The conductive nanotubes may include, for example, CNTs. The conductive nanowires may include, for example, Ag nanowires. However, example embodiments are not limited thereto.

A dopant may be further included in the ink 230 for forming the 2D material layer 240. That is, when the 2D nanomaterials 241 include an undoped semiconductor material, the dopant may be further mixed with the solvent 243.

Figure 5B:
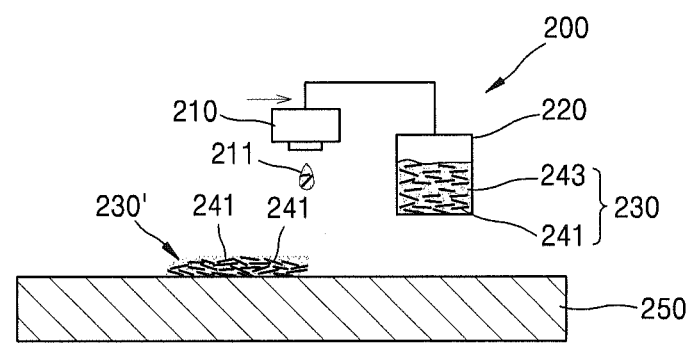
Figure 5C:
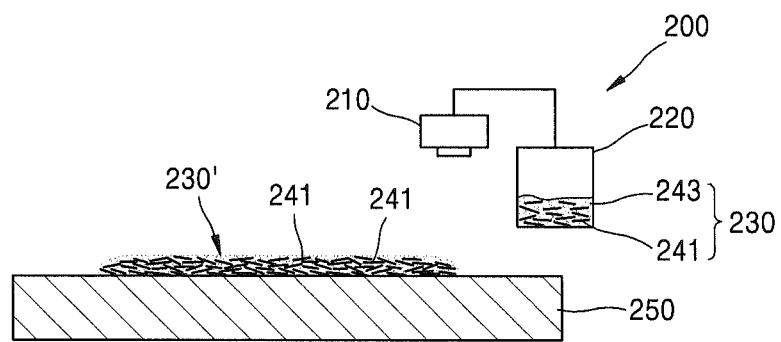

Referring to FIG. 5B, the ink 230 is ejected onto a desired (and/or alternatively predetermined) position of the substrate 250 by using the inkjet printing apparatus 200. In this process, the inkjet head 210 may move in a desired (and/or alternatively predetermined) direction, and the ink 230 may be ejected as droplets 211 from the inkjet head 210 to form an ink pattern 230' on the substrate 250. Referring to FIG. 5C, when inkjet printing ends, the ink pattern 230' including the 2D nanomaterials 241 and the solvent 243 may be formed in a desired (and/or alternatively predetermined) shape on the substrate 250.

Figure 5D:
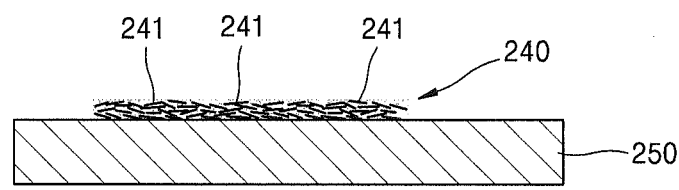

Referring to FIG. 5D, when the ink pattern 230' is dried to remove the solvent 243, the 2D material layer 240 including the 2D nanomaterials 241 may be formed on the substrate 250. The ink pattern 230' may be dried by using natural drying or by applying heat. As such, the 2D material layer 240 may be formed by using inkjet printing so that at least some of the 2D nanomaterials 241 overlap one another. The 2D material layer 240 may have a thickness that ranges from about several nm to about hundreds of nm and a size that ranges from about hundreds of nm to hundreds of μm. However, example embodiments are not limited thereto.

As described above, a dopant may be further included in the ink 230 for forming the 2D material layer 240 or the 2D nanomaterials 241 that are previously doped with desired (and/or alternatively predetermined) impurities may be included in the ink 230. In this case, the 2D material layer 240 that is formed by using inkjet printing may include a semiconductor material having a desired (and/or alternatively predetermined) conductivity type. For example, the 2D material layer 240 may include a p-type semiconductor material or an n-type semiconductor material.

Also, as described above, a conductive material may be further included in the ink 230 for forming the 2D material layer 240. The conductive material may include at least one among, for example, graphene, conductive particles, conductive nanotubes, and conductive nanowires. In this case, the conductive material in the 2D material layer 240 that is formed by using inkjet printing may increase electrical conductivity between the 2D nanomaterials 241.

A method of manufacturing an electronic device including a 2D material layer will now be explained.

FIGS. 6A through 6D are cross-sectional views for explaining a method of manufacturing an electronic device, according to example embodiments. An electronic device that is manufactured by using the method of FIGS. 6A through 6D may be the electronic device 100, which is a transistor device, of FIGS. 1 and 2.

Figure 6A:
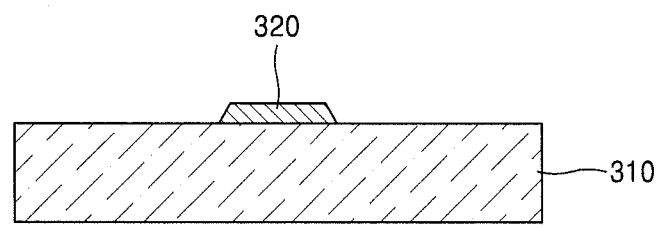
FIGS. 6A through 6D are cross-sectional views for explaining a method of manufacturing an electronic device, according to example embodiments.

Referring to FIG. 6A, a substrate 310 is prepared, and then a gate electrode 320 is formed on the substrate 310. The substrate 310 may be a semiconductor substrate. For example, the substrate 310 may be a silicon substrate. However, example embodiments are not limited thereto, and the substrate 310 may be a substrate formed of any of various materials. Also, the substrate 310 may be a substrate formed of a flexible material such as a plastic substrate. An insulating layer (not shown) may be further provided on a top surface of the substrate 310 in order to insulate the substrate 310 from the gate electrode 320. The insulating layer may include, for example, but is not limited to, silicon oxide or silicon nitride. When the substrate 310 includes an insulating material, the insulating layer may not be provided on the top surface of the substrate 310.

The gate electrode 320 is formed on the top surface of the substrate 310. The gate electrode 320 may be formed by using inkjet printing. In this case, the gate electrode 320 may be formed by printing ink including a conductive material on the top surface of the substrate 310 by using an inkjet printing apparatus and then drying the ink. The conductive material that is included in the ink may include at least one selected from the group consisting of, for example, but not limited to, graphene, Ag particles, Au particles, Pt particles, Cu particles, CNTs, and Ag nanowires. The gate electrode 320 may be formed by using another deposition method, instead of inkjet printing.

Figure 6B:
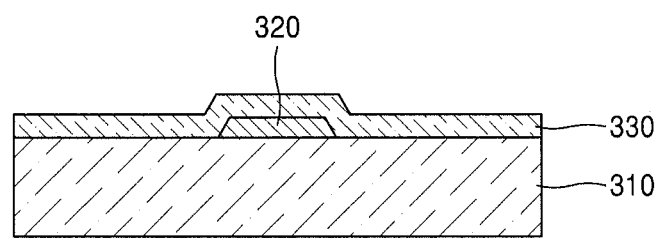

Referring to FIG. 6B, a gate insulating layer 330 is formed on the substrate 310 to cover the gate electrode 320. The gate insulating layer 330 may include a high-k dielectric material. For example, the gate insulating layer 330 may include, but is not limited to, silicon oxide, silicon nitride, silicon oxynitride, aluminum oxide, hafnium oxide, and/or insulating polymer. The gate insulating layer 330 may be formed by using inkjet printing. In this case, the gate insulating layer 330 may be formed by printing ink including a desired (and/or alternatively predetermined) insulating material on the substrate 310 by using an inkjet printing apparatus to cover the gate electrode 320 and then drying the ink. The gate insulating layer 330 may be formed by using another deposition method, instead of inkjet printing.

Figure 6C:
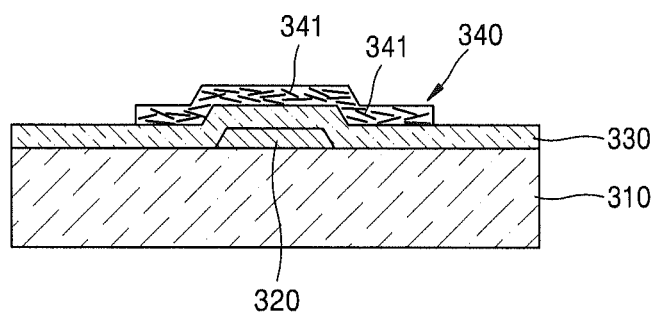

Referring to FIG. 6C, a 2D material layer 340 is formed on the gate insulating layer 330. The 2D material layer 340 may be disposed to correspond to the gate electrode 320. The 2D material layer 340 that functions as a channel layer may be formed so that 3D nanomaterials 341 having semiconductor characteristics overlap one another.

The 2D material layer 340 may be formed by using inkjet printing as described above. In this case, the 2D material layer 340 may be formed by printing ink in which the 2D nanomaterials 341 are mixed with a solvent on a top surface of the gate insulating layer 330 by using an inkjet printing apparatus and then drying the ink. The solvent may include at least one selected from the group consisting of, for example, but not limited to, water, acetone, methanol, ethanol, isopropanol, cyclohexanone, cyclohexane, chlorobenzene, chloroform, formamide, N-methyl formamide, N-methyl pyrrolidinone, N-vinyl pyrrolidinone, dimethylsulphoxide, benzonitrile, cyclohecyl-pyrrolidinone, N-dodecyl pyrrolidone, benzyl benzoate, benzyl ether bromobenzene, dimethylacetamide, and dimethylformamide.

The 2D nanomaterials 341 may include a semiconductor material. For example, the 2D nanomaterials 341 may include at least one selected from the group consisting of TMD, phosphorene (black phosphorus), germanane, and silicene. TMD may include at least one selected from the group consisting of, for example, $MoS_2$, $MoSe_2$, $MoTe_2$, $WS_2$, $WSe_2$, $WTe_2$, $TaS_2$, $TaSe_2$, $TiS_2$, $TiSe_2$, $HfS_2$, $HfSe_2$, $SnS_2$, $SnSe_2$, $GeS_2$, $GeSe_2$, $GaS_2$, $GaSe_2$, $Bi_2S_3$, $Bi_2Se_3$, and $Bi_2Te_3$. The 2D nanomaterials 341 may include an undoped semiconductor material. Alternatively, the 2D nanomaterials 341 may be doped with desired (and/or alternatively predetermined) impurities.

Each of the 2D nanomaterials 341 may include one layer or a plurality of layers. For example, each of the 2D nanomaterials 341 may include tens of layers. Each layer of each of the 2D nanomaterials 341 may have a thickness that is equal to or less than about several nm. For example, each layer of each of the 2D nanomaterials 341 may have a thickness that is equal to or less than 2 nm. However, example embodiments are not limited thereto. Each layer of each of the 2D nanomaterials 341 may have a size that ranges from about tens of nm to hundreds of nm. Each of the 2D nanomaterials 341 may have any of various planar shapes.

A mixture ratio of the 2D nanomaterials 341 to the solvent of the ink may range from, but is not limited to, about 1 µg/mL to about 100 mg/mL. The 2D material layer 340 may be formed by printing the ink on the top surface of the gate insulating layer 330 to have a desired (and/or alternatively predetermined) shape and then drying the ink. The 2D material layer 340 may be formed so that at least some of the 2D nanomaterials 341 overlap one another. As such, a thickness and a size of the 2D material layer 341 that is formed by using inkjet printing may respectively range from about several nm to about hundreds of nm and may range from about hundreds of nm to about hundreds of µm.

A conductive material (not shown) may be further mixed with the solvent of the ink. The conductive material may include at least one among, for example, graphene, conductive particles, conductive nanotubes, and conductive nanowires. The conductive particles may include at least one selected from the group consisting of, for example, Ag, Au, Pt, Cu, and fullerene, the conductive nanotubes may include, for example, CNTs, and the conductive nanowires may include, for example, Ag nanowires. However, example embodiments are not limited thereto. As such, when the 2D material layer 340 is formed by using the ink including the 2D nanomaterials 341 and the conductive material, the conductive material connects the 2D nanomaterials 341, thereby increasing conductivity of the 2D material layer 341 and increasing an on-current of the electronic device.

Also, a dopant (not shown) may be further mixed with the solvent of the ink. As such, when the dopant is further included in the solvent or the 2D nanomaterials 341 are previously doped, the 2D material layer 340 may have a desired (and/or alternatively predetermined) conductivity type. For example, the 2D material layer 340 may include a p-type semiconductor material or an n-type semiconductor material. As such, since the 2D material layer 340 is doped with desired (and/or alternatively predetermined) impurities, an off-current of the electronic device may be reduced.

Figure 6D:
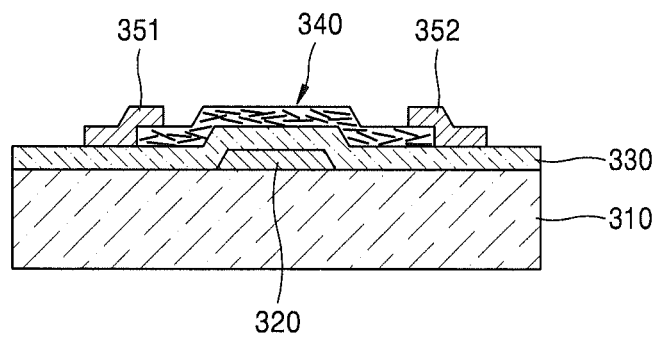

Referring to FIG. 6D, the electronic device is completed by forming first and second electrodes 351 and 352 on both sides of the 2D material layer 340. The first and second electrodes 351 and 352 may be respectively a source electrode and a drain electrode. Alternatively, the first and second electrodes 351 and 352 may be respectively a drain electrode and a source electrode. The first and second electrodes 351 and 352 may be formed by using inkjet printing. In this case, the first and second electrodes 351 and 352 may be formed by printing ink including a conductive material on top surfaces of the gate insulating layer 330 and the 2D material layer 340 by using an inkjet printing apparatus to have a desired (and/or alternatively predetermined) shape and then drying the ink. The conductive material that is included in the ink may include at least one selected from the group consisting of, for example, graphene, Ag particles, Au particles, Pt particles, Cu particles, CNTs, and Ag nanowires. The first and second electrodes 351 and 352 may be formed by using another deposition method, instead of inkjet printing.

A plurality of the electronic devices may be manufactured. In this case, an insulating layer including a low-k dielectric material such as fluorinated graphene or graphene oxide may be formed between the electronic devices. The insulating layer may be formed by using inkjet printing.

As described above, since the gate electrode 320, the gate insulating layer 330, the 2D material layer 340, and the first and second electrodes 351 and 352 are formed by using inkjet printing, the electronic device may be simply manufactured. Also, since the 2D material layer 340 may be formed to have a great size by using inkjet printing, the electronic device may be formed to have a large area.

Figure 7:
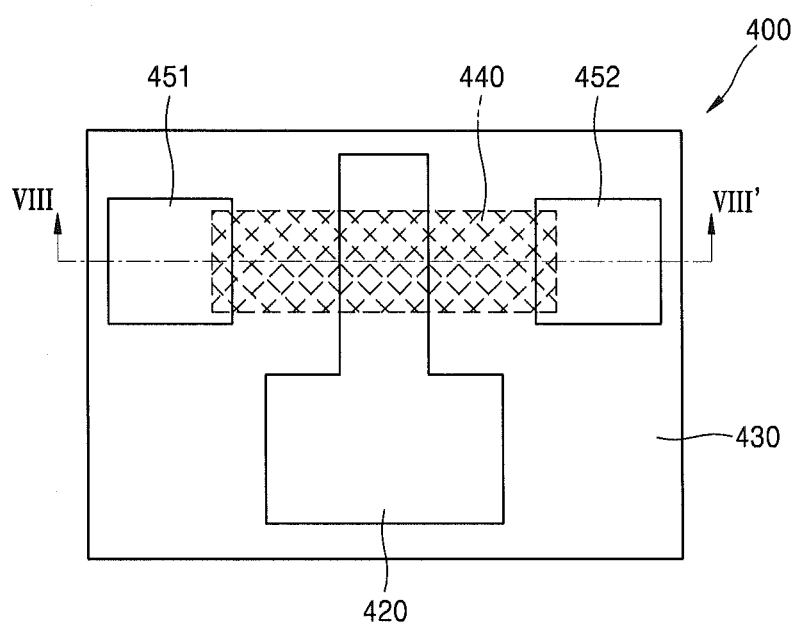
FIG. 7 is a plan view illustrating an electronic device according to example embodiments.
Figure 8:
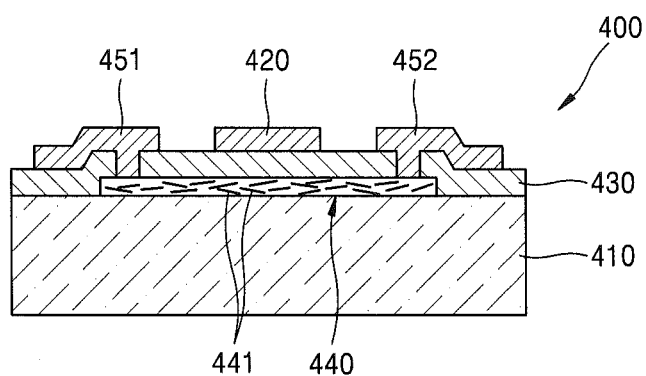
FIG. 8 is a cross-sectional view taken along line VIII-VIII' of FIG. 7.

FIG. 7 is a plan view illustrating an electronic device 400 according to example embodiments. FIG. 8 is a cross-sectional view taken along line VIII-VIII' of FIG. 7. A transistor device having a top-gate structure is illustrated as the electronic device 400 in FIGS. 7 and 8.

Referring to FIGS. 7 and 8, the electronic device 400 includes a 2D material layer 440 that is provided on a substrate 410, a gate insulating layer 430, a gate electrode 420, and first and second electrodes 451 and 452. The substrate 410 may be a substrate formed of any of various materials such as a semiconductor substrate, and may be a substrate formed of a flexible material such as a plastic substrate. An insulating layer (not shown) may be further provided on a top surface of the substrate 410 in order to insulate the substrate 410 from the 2D material layer 440. The insulating layer may include, for example, but is not limited to, silicon oxide or silicon nitride. When the substrate 410 includes an insulating material, the insulating layer may not be provided on the top surface of the substrate 410.

The 2D material layer 440 that functions as a channel layer is provided on the substrate 410. As described above, the 2D material layer 440 may be formed so that at least some of a plurality of 2D nanomaterials 441 overlap one another. The 2D nanomaterials 440 are nano-sized materials having semiconductor characteristics and having a 2D crystal structure.

Each of the 2D nanomaterials 441 may include one layer or a plurality of layers. For example, each of the 2D nanomaterials 441 may include tens of layers. Each layer of each of the 2D nanomaterials 441 may have a thickness that is equal to or less than about several nm and may have a size that ranges from about tens of nm to about hundreds of nm. Each of the 2D nanomaterials 441 may have any of various planar shapes. The 2D material layer 440 may be formed by using inkjet printing as described above. A thickness and a size of the 2D material layer 440 that is formed by using inkjet printing may respectively range from about several nm to about hundreds of nm and range from about hundreds of nm to about hundreds of μm.

The 2D material layer 440 includes the 2D nanomaterials 441 having semiconductor characteristics. For example, the 2D nanomaterials 441 may include at least one selected from the group consisting of TMD, phosphorene (black phosphorus), germanane, and silicene. TMD may include at least one selected from the group consisting of, for example, $MoS_2$, $MoSe_2$, $MoTe_2$, $WS_2$, $WSe_2$, $WTe_2$, $TaS_2$, $TaSe_2$, $TiS_2$, $TiSe_2$, $HfS_2$, $HfSe_2$, $SnS_2$, $SnSe_2$, $GeS_2$, $GeSe_2$, $GaS_2$, $GaSe_2$, $Bi_2S_3$, $Bi_2Se_3$, and $Bi_2Te_3$. As described above, since an on/off current ratio is increased to be equal to or greater than 100 when the 2D material layer 440 is used as a channel layer of the electronic device 400, operation efficiency of the electronic device 400 may be improved.

The 2D material layer 440 may further include a material other than the 2D nanomaterials 441. For example, the 2D material layer 440 may include the plurality of 2D nanomaterials 441 and a conductive material (not shown). The 2D nanomaterials 441 may be formed so that at least some of the 2D nanomaterials 441 overlap one another, and the conductive material may be attached to the 2D nanomaterials 441 and may increase electrical conductivity between the 2D nanomaterials 441. The conductive material that is included in the 2D material layer 440 may include at least one among, for example, graphene, conductive particles, conductive nanotubes, and conductive nanowires. The conductive particles may include at least one selected from the group consisting of, for example, Ag, Au, Pt, Cu, and fullerene. The conductive nanotubes may include, for example, CNTs. The conductive nanowires may include, for example, Ag nanowires.

A dopant (not shown) may be further included in the 2D material layer 440 that includes the 2D nanomaterials 441 or both the 2D nanomaterials 441 and the conductive material. The dopant may be included in ink when the 2D material layer 440 is formed by using inkjet printing. The 2D nanomaterials 441 that are included in the 2D material layer 440 may be previously doped with impurities.

The gate insulating layer 430 is provided on the substrate 410 to cover the 2D material layer 440. The gate insulating layer 430 may include any of various insulating materials. For example, the gate insulating layer 430 may include, but is not limited to, silicon oxide, silicon nitride, silicon oxynitride, aluminum oxide, hafnium oxide, and/or insulating polymer. The gate insulating layer 430 may be formed by using inkjet printing or another deposition method.

The gate electrode 420 is provided on the gate insulating layer 430. The gate electrode 420 may be disposed to correspond to the 2D material layer 440. The gate electrode 420 may include a conductive material. For example, the gate electrode 420 may include graphene, CNTs, or a metal such as Ag, Au, Pt, or Cu. The gate insulating layer 430 may be formed by using inkjet printing or another deposition method.

The first and second electrodes 451 and 452 are provided on both sides of the gate electrode 420. The first and second electrodes 451 and 452 are provided on the gate insulating layer 430 to be electrically connected to both sides of the 2D material layer 440. The first and second electrodes 451 and 452 may be respectively a source electrode and a drain electrode. Alternatively, the first and second electrodes 451 and 452 may be respectively a drain electrode and a source electrode. The first and second electrodes 451 and 452 may include a conductive material, like the gate electrode 420. As described below, the first and second electrodes 451 and 452 may be formed by using inkjet printing or another deposition method.

Figure 9:
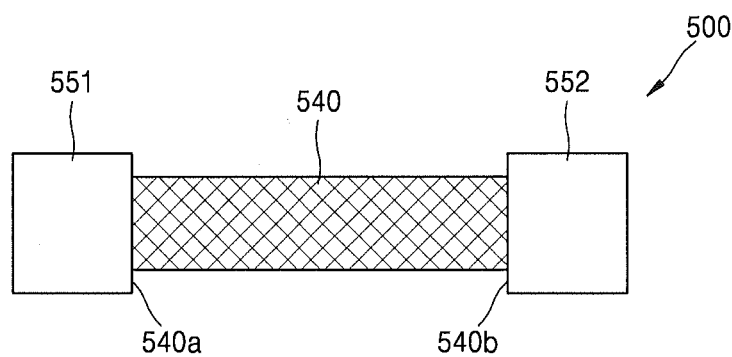
FIG. 9 is a cross-sectional view illustrating an electronic device according to example embodiments.

FIG. 9 is a cross-sectional view illustrating an electronic device 500 according to example embodiments. A diode device that forms a Schottky junction is illustrated as the electronic device 500 in FIG. 9.

Referring to FIG. 9, the electronic device 500 includes first and second electrodes 551 and 552 that are spaced part from each other and a 2D material layer 540 that connects the first and second electrodes 551 and 552. The first and second electrodes 541 and 552 may include a metal. The first and second electrodes 541 and 542 may be formed by using inkjet printing or another deposition method.

The 2D material layer 540 may be formed so that at least some of 2D nanomaterials (not shown) having semiconductor characteristics overlap one another. The 2D material layer 540 may be formed by using inkjet printing as described above. The 2D material layer 540 has been explained, and thus a detailed explanation thereof will not be given. The 2D material layer 540 may further include a conductive material (not shown) such as graphene, conductive particles, conductive nanotubes, or conductive nanowires. The 2D material layer 540 may further include a dopant (not shown). The dopant may be included in ink when the 2D material layer 540 is formed by using inkjet printing. The 2D nanomaterials that are included in the 2D material layer 540 may be previously doped with impurities.

As such, since the 2D material layer 540 has semiconductor characteristics, the 2D material layer 540 may form a Schottky junction with the first and second electrodes 551 and 552 including a metal. That is, a Schottky junction may be formed at a boundary 540a between the first electrode 551 and the 2D material layer 540 and a boundary 540b between the second electrode 552 and the 2D material layer 540.

Figure 10:
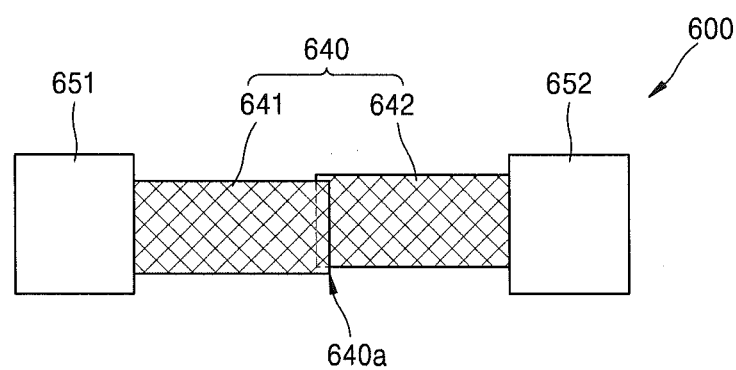
FIG. 10 is a cross-sectional view illustrating an electronic device according to example embodiments.

FIG. 10 is a cross-sectional view illustrating an electronic device 600 according to example embodiments. A diode device that forms a p-n junction is illustrated as the electronic device 600 in FIG. 10.

Referring to FIG. 10, the electronic device 600 includes first and second electrodes 651 and 652 that are spaced apart from each other and a 2D material layer 640 that connects the first and second electrodes 651 and 652. The first and second electrodes 651 and 652 may include a conductive material. The first and second electrodes 651 and 652 may be formed by using inkjet printing or another deposition method.

The 2D material layer 640 may include a first conductivity type material layer 641 and a second conductivity type material layer 642. The first conductivity type material layer 641 is provided to electrically connect the first electrode 651 and the second conductivity type material layer 642, and the second conductivity type material layer 642 is provided to electrically connect the second electrode 652 and the first conductivity type material layer 641. Accordingly, the first and second conductivity type material layers 641 and 642 may be provided to partially overlap each other. The first and second conductivity type material layers 641 and 642 may be formed by using, for example, inkjet printing.

The first conductivity type material layer 641 may include 2D nanomaterials and a first conductivity type dopant (not shown). The 2D nanomaterials may be provided so that at least some of the 2D nanomaterials overlap one another. The first conductivity type dopant may be p-type impurities or n-type impurities. When the first conductivity type material layer 641 is formed by using inkjet printing, the first conductivity type dopant may be included in ink along with the 2D nanomaterials. The 2D nanomaterials may be previously doped with the first conductivity type dopant and then may be mixed with the ink.

The second conductivity type material layer 641 may include 2D nanomaterials (not shown) and a second conductivity type dopant (not shown). The 2D nanomaterials may be provided so that at least some of the 2D nanomaterials overlap one another. The second conductivity type dopant may be n-type impurities or p-type impurities. In detail, when the first conductivity type dopant is p-type impurities, the second conductivity type dopant may be n-type impurities. When the first conductivity type dopant is n-type impurities, the second conductivity type dopant may be p-type impurities. When the second conductivity type material layer 642 is formed by using inkjet printing, the second conductivity type dopant may be included in ink along with the 2D nanomaterials. The 2D nanomaterials may be previously doped with the second conductivity type dopant and then may be mixed with the ink. As described above, a p-n junction may be formed at a boundary between the first conductivity type material layer 641 and the second conductivity type material layer 642 of the 2D material layer 640.

Figure 11:
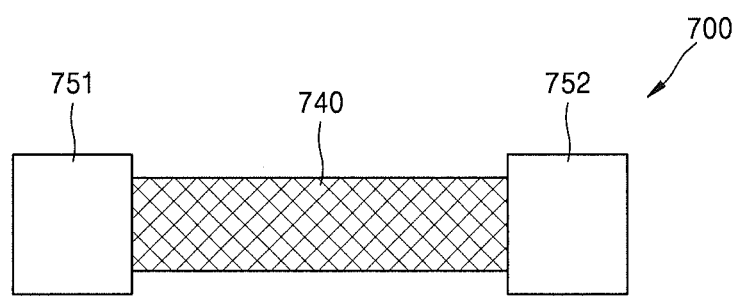
FIG. 11 is a cross-sectional view illustrating an electronic device according to example embodiments.

FIG. 11 is a cross-sectional view illustrating an electronic device 700 according to example embodiments. A sensor device that detects a specific gas is illustrated as the electronic device 700 in FIG. 11.

Referring to FIG. 11, the electronic device 700 includes first and second electrodes 751 and 752 that are spaced apart from each other and a 2D material layer 740 that connects the first and second electrodes 751 and 752. The first and second electrodes 751 and 752 may include a conductive material. The first and second electrodes 751 and 752 may be formed by using inkjet printing or another deposition method.

The 2D material layer 740 may be formed so that at least some of 2D nanomaterials (not shown) having semiconductor characteristics overlap one another. The 2D material layer 740 may be formed by using inkjet printing as described above. The 2D material layer 740 has been explained, and thus a detailed explanation thereof will not be given. As such, the 2D material layer 740 including the 2D nanomaterials having semiconductor characteristics may function as a gas absorber that selectively absorbs a specific gas such as hydrogen or oxygen. Accordingly, in the electronic device 700 of FIG. 11, when a specific gas is adsorbed by the 2D material layer 740, whether there is the specific gas may be detected by using the first and second electrodes 751 and 752.

As described above, according to example embodiments, since a 2D material layer including 2D nanomaterials having semiconductor characteristics is used as a channel layer, operation efficiency of an electronic device such as a transistor device may be improved. The 2D material layer may be applied to various electronic devices such as a diode device and a sensor device. When the 2D material layer is formed by using inkjet printing, the electronic device may be manufactured to have a large area. In addition, since all elements of the electronic device are formed by using inkjet printing, the electronic device may be simply manufactured.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. An electronic device comprising:
   a first electrode;
   a second electrode spaced apart from the first electrode; and
   a two-dimensional (2D) material layer connected to the first and second electrodes, the 2D material layer including a plurality of 2D nanomaterials, having semiconductor characteristics, at least some of the 2D nanomaterials partially overlapping one another, wherein the plurality of 2D nanomaterials are planar in shape, and each of the plurality of 2D nanomaterials include at least one of phosphorene, germanane, and silicene.

2. The electronic device of claim 1, wherein the 2D material layer further includes a conductive material.

3. The electronic device of claim 2, wherein the conductive material includes at least one of graphene, conductive particles, conductive nanotubes, and conductive nanowires.

4. The electronic device of claim 1, wherein the 2D material layer further includes a dopant.

5. The electronic device of claim 1, wherein the 2D material layer is a channel layer of the electronic device.

6. The electronic device of claim 5, further comprising:
a gate insulating layer on the 2D material layer; and
a gate electrode on the gate insulating layer.

7. The electronic device of claim 1, wherein a Schottky junction is formed between the 2D material layer and at least one of the first and second electrodes.

8. The electronic device of claim 1, wherein a p-n junction is formed between the plurality of 2D nanomaterials.

9. The electronic device of claim 1, wherein each of the plurality of 2D nanomaterials include at least one layer.

10. The electronic device of claim 4, wherein the dopant includes one of alkali metal, $AuCl_3$, a polymer, $HPtCl_4$, $AuCl_3$, $HAuCl_4$, silver trifluoromethanesulfonate, $AgNO_3$, $H_2PdCl_6$, palladium acetate ($Pd(OAc)_2$), and $Cu(CN)_2$.

11. An electronic device comprising:
a first electrode;
a second electrode spaced apart from the first electrode; and
a two-dimensional (2D) material layer connected to the first and second electrodes, the 2D material layer including a plurality of 2D nanomaterials, having semiconductor characteristics, at least some of the 2D nanomaterials partially overlapping one another, wherein
the plurality of 2D nanomaterials are planar in shape, and each of the plurality of 2D nanomaterials include at least one of a transition metal dichalcogenide (TMD), phosphorene, germanane, and silicene,
the 2D material layer further includes a dopant,
the dopant includes one of alkali metal, $AuCl_3$, a polymer, $HPtCl_4$, $AuCl_3$, $HAuCl_4$, silver trifluoromethanesulfonate, $AgNO_3$, $H_2PdCl_6$, palladium acetate ($Pd(OAc)_2$), and $Cu(CN)_2$,
the alkali metal includes one of K and Li, and
the polymer is polyethylenimine.

12. The electronic device of claim 1, wherein several of the plurality of 2D nanomaterials extend non-parallel relative to each other.

13. The electronic device of claim 1, wherein the 2D material layer is a dried ink.

14. The electronic device of claim 1, wherein the at least some of the plurality of 2D nanomaterials partially overlapping one another include two 2D materials that extend non-parallel to each other and contain a same material.

15. The electronic device of claim 1, wherein
the plurality of 2D nanomaterials include sidewalls,
and the sidewalls of two of the plurality of 2D nanomaterials contact each other.

* * * * *